United States Patent [19]
Aydil et al.

[11] Patent Number: 5,277,752
[45] Date of Patent: Jan. 11, 1994

[54] METHOD FOR CONTROLLING PLASMA PROCESSES

[75] Inventors: Eray S. Aydil, Summit; Richard A. Gottscho, Maplewood; Jeffrey A. Gregus, Basking Ridge; Mark A. Jarnyk, Berkeley Heights, all of N.J.

[73] Assignee: AT&T Bell Laboratories, Murray Hill, N.J.

[21] Appl. No.: 963,150

[22] Filed: Oct. 19, 1992

[51] Int. Cl.⁵ .......................................... H01L 21/306
[52] U.S. Cl. .................................... 156/643; 156/626; 427/534; 427/535; 427/575
[58] Field of Search ................. 156/626, 643; 427/534, 427/535, 575

[56] References Cited

U.S. PATENT DOCUMENTS

| | | | |
|---|---|---|---|
| 4,242,188 | 12/1980 | Niinomi | 204/164 |
| 4,340,456 | 7/1982 | Robinson | 204/192 |
| 4,935,303 | 6/1990 | Ikoma | 428/408 |
| 5,133,830 | 7/1992 | Asaka | 156/643 |
| 5,145,554 | 9/1992 | Seki | 156/643 |

OTHER PUBLICATIONS

S. Wolf, Silicon Processing forth VLSI Era, 1990, Lattic Press, pp. 160–176, 542–547, 568–572, 574–577.
Vossen & Kern, Thin Film Processes, 1988, Academic Press, Inc. pp. 338–357, 401–481, 499–512.
K. Wust, "Electron temperature and plasma density of capacitive rf-discharges in noble gases", *Rev. Sci. Instrum.* vol. 63, pp. 2581–2583, (1992).

*Primary Examiner*—Tom Thomas
*Assistant Examiner*—Joni Chang
*Attorney, Agent, or Firm*—Glen E. Books

[57] ABSTRACT

In accordance with the invention, a plasma generated within a plasma confinement chamber for use in manufacturing semiconductor devices is controlled by monitoring both the neutral gas pressure P and the neutral gas temperature T. The process parameters P and T are then adjusted to control $P/T^n$. In a preferred embodiment the pressure is adjusted to maintain $P/T$ constant by adjusting the gas flow rate or the outlet pumping speed. The result is a plasma exhibiting enhanced stability over prolonged periods of time.

8 Claims, 5 Drawing Sheets

5,277,752

METHOD FOR CONTROLLING PLASMA PROCESSES

FIELD OF THE INVENTION

The present invention relates to methods for controlling plasma processes of the type used in the microelectronics industry for the etching, deposition and cleaning of thin films.

BACKGROUND OF THE INVENTION

Plasma processes have become important in the manufacture of semiconductor devices such as integrated circuits. Low pressure glow discharge plasmas are used in the anisotropic etching of fine-line patterns, and plasmas are routinely used for low temperature deposition of insulating and passivating layers such as silicon nitride.

Typical plasma reactors for microelectronics applications comprise a low pressure chamber, a source of gas to be converted to plasma, and a source of energy to convert the gas to plasma. Among the most popular of new plasma generators are those based on electron cyclotron resonance heating. In ECR reactors microwaves from an external source are launched through a dielectric window into the chamber to excite the gas within the chamber and thus create a plasma. Such generators permit separate control of plasma generation and ion transport. Thus, for example, in etching, ion flux and ion energy can be controlled separately to optimize throughput, selectivity and anisotropy while minimizing ion-induced atomic displacement damage.

Unfortunately plasmas are not well understood and their behavior can fluctuate in seemingly random ways which can greatly affect their useful properties. Specifically, by virtue of their non-linear properties, plasmas are prone to instability, bistability, and hysteresis which can deteriorate the reproducibility of critical semiconductor manufacturing processes. Present control schemes based on maintaining constant pressure have not been adequate to prevent serious fluctuations in etch rate and deposition rate in plasma-based semiconductor manufacturing processes.

SUMMARY OF THE INVENTION

In accordance with the invention, a plasma generated within a plasma confinement chamber for use in manufacturing semiconductor devices is controlled by monitoring both the neutral gas pressure P and the neutral gas temperature T. The process parameters P and T are then adjusted to control $P/T^n$. In a preferred embodiment the pressure is adjusted to maintain $P/T$ constant by adjusting the gas flow rate or the outlet pumping speed. The result is a plasma exhibiting enhanced stability over prolonged periods of time.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
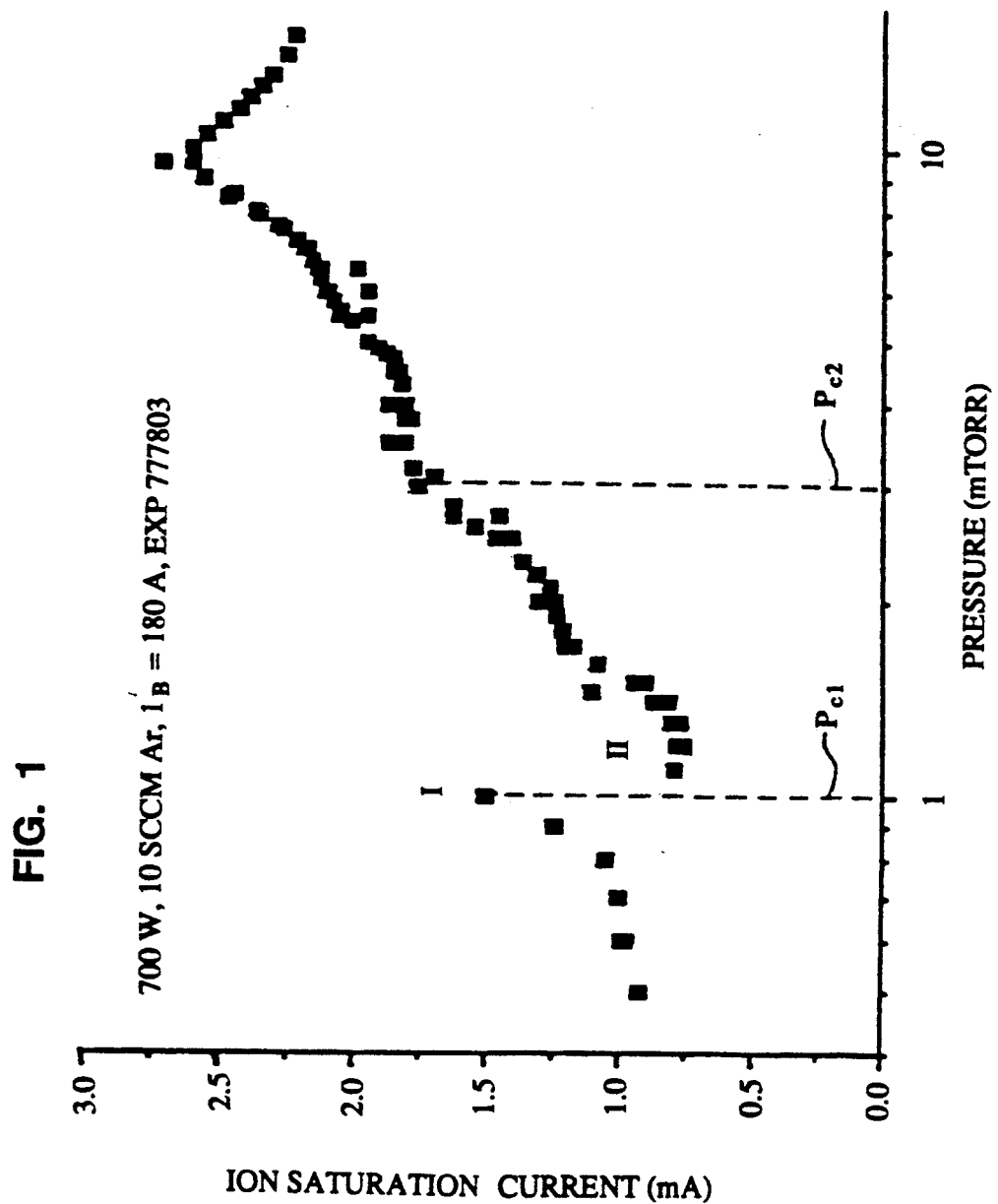
FIG. 1 is a graphical illustration showing ion current density and floating potential as a function of pressure.

Referring to the drawings, FIG. 1 is a graphical illustration useful in understanding the problem to which the present invention is directed. Specifically, FIG. 1 is a plot of the floating potential versus pressure at temperature equilibrium for a representative ECR generator. With each pressure increment the reactor is given a period of about 60 s to achieve equilibrium before the potential is measured. As can be seen, the potential exhibits sharp transitions at pressures of about 1 m Torr and at about 3.0 m Torr. In particular, the bistability at 1 m Torr is sufficiently large that it can alter the ion flux to device wafers by more than a factor of two. Moreover, if the pressure is changed slowly, a hysteresis can be observed and the transition pressure will depend on the direction of pressure change.

Figure 2:
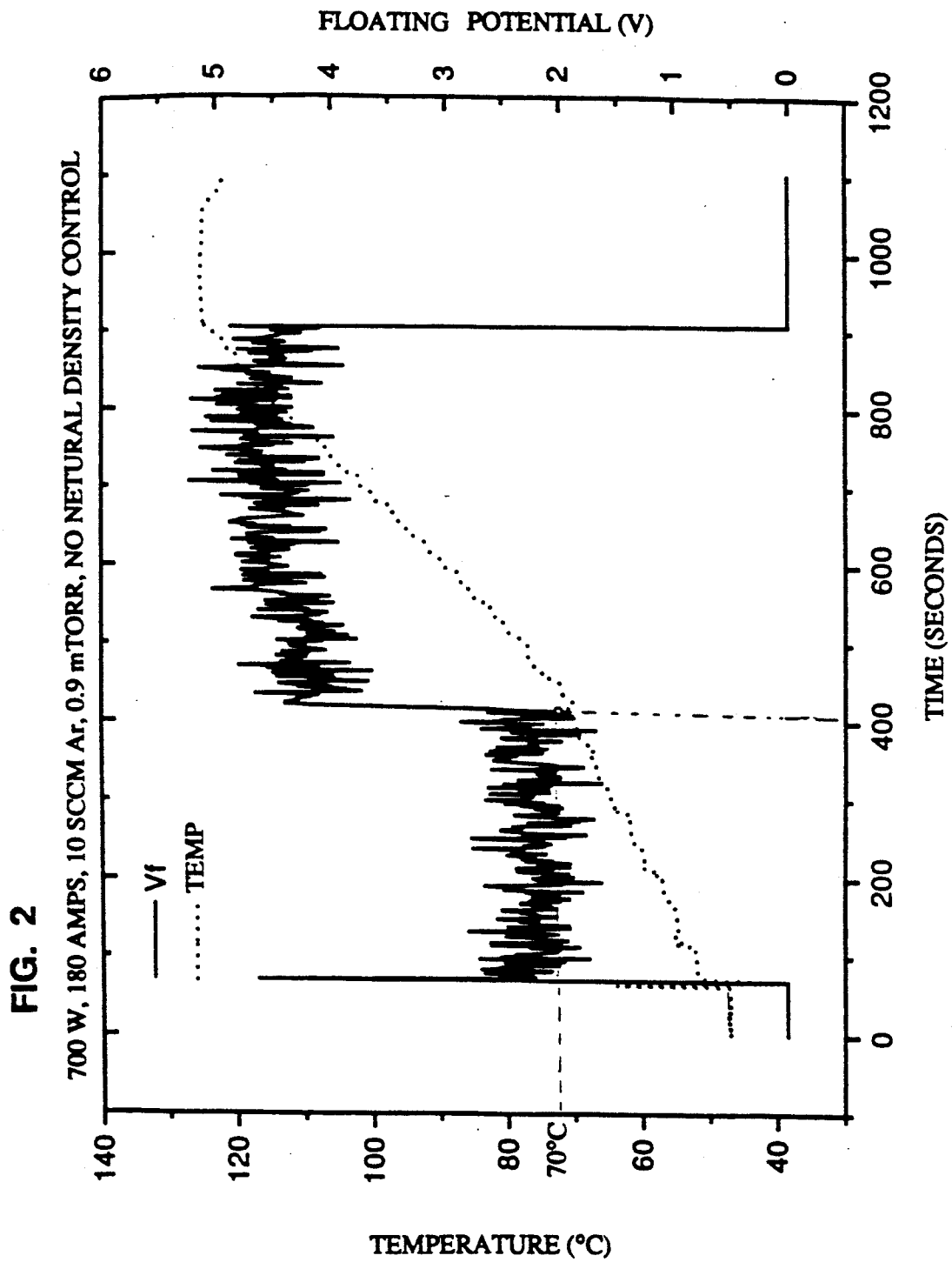
FIG. 2 is a graphical illustration showing the floating potential and wall temperature as a function of time for a plasma controlled by gas pressure alone.
Figure 3:
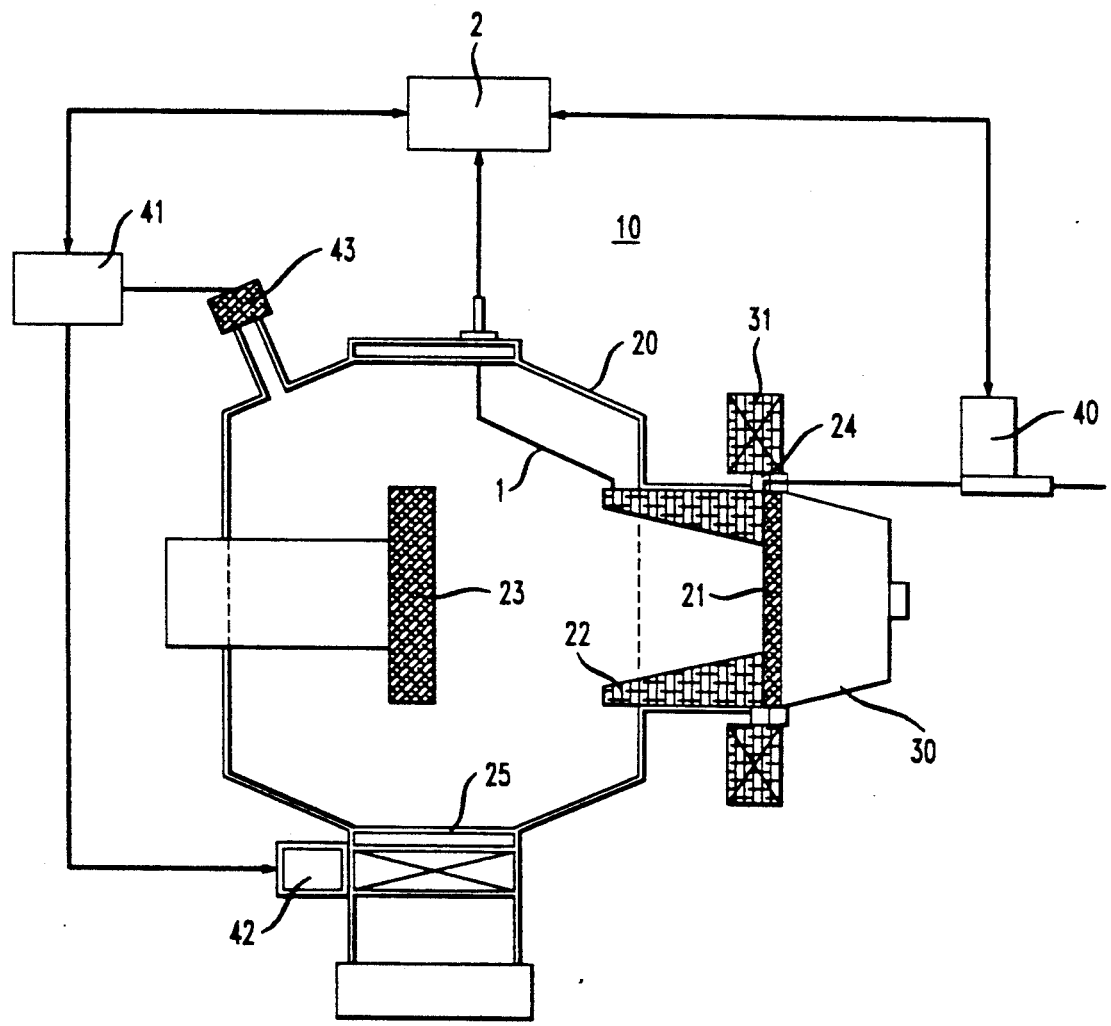
FIG. 3 is a schematic cross section of plasma generating apparatus in accordance with the invention.

In order to further study this bistability, applicants modified an ECR plasma generator by placing a thermocouple within the chamber (as shown in FIG. 3) to measure the gas temperature as represented by the temperature of the quartz liner. They then measured the temperature and floating potential as a function of time for representative operating conditions at a pressure of 0.9 m Torr. These measurements are plotted in FIG. 2 with temperature as the dotted line and potential as the solid line. As can be seen, the temperature increases from an initial 47° C. under these isobaric conditions to more than 120° C. after several hundred seconds. The floating potential is initially approximately constant, but when the temperature reaches about 70° C., the potential suddenly increases. Additional experiments, both isobaric and isothermal, revealed that this transition occurred at the same ratio of pressure to temperature $P/T$. Based on their experiments, applicants concluded that conventional control of plasma generators based on pressure alone was inadequate.

In order to alleviate the problem of unwanted plasma instabilities of the type shown in FIGS. 1 and 2, applicants determined to use a new method of control based upon maintaining a proportional relation between P and a power of T, i.e. P proportional to $T^n$ ($n \neq 0$). In the simplest case where a constant ion flux is desired, the relation is linear, i.e. P is proportional to T. Where a constant neutral flux is desired as in the etching of aluminum, P is preferably proportional to $T^{\frac{1}{2}}$. More complex models can use other values of n.

FIG. 3 is a schematic illustration of a typical plasma generating apparatus adapted for $P/T^n$ control. In essence the FIG. 3 apparatus is a conventional ECR plasma reactor modified by the presence of a temperature probe 1 to provide a measure of the temperature T of the plasma and a system controller 2 responsive to P and T to control $P/T^n$. This control is conveniently effected by varying the gas pressure in such a fashion as to maintain $P/T^n$ substantially constant. In a preferred embodiment useful, for example, in the etching of polysilicon, the controller is adapted to vary the gas pressure so that P/T is maintained at values removed at least 5% (in either direction) from values of P/T which exhibit plasma instability.

Specifically, the plasma reactor 10 can be a conventional ECR reactor comprising a low pressure chamber 20 including a quartz window 21, a quartz plasma liner 22 and an electrode 23 for supporting a workpiece (not shown) to be plasma processed as by etching or deposition. The chamber 20 is provided with gas entry aperture 24 for permitting introduction of neutral gas and a gas exit aperture 25 for removing gas and plasma products.

The plasma generating apparatus comprises a microwave source 30 and an electromagnet 31. The source 30 launches through window 21 microwaves at the electron cyclotron resonance frequency determined by the field of electromagnet 31. Liner 22 is designed to conform to the shape of the magnetic field lines in order to avoid sputtering of the chamber walls by the plasma.

The system control arrangement comprises a gas inlet controller 40 for controlling the rate of gas flow into chamber 20, an outlet controller 41 for controlling the rate at which gas and plasma products are removed from the chamber by pump 42, a pressure sensor 43 for measuring the pressure P in chamber 20 and a temperature probe 1 to provide a measure of the temperature T in the plasma. Preferably temperature probe 1 is disposed on a back wall protected by liner 22 from the plasma. Sensor 43 and probe 1 provide to system controller 2 signals indicative of P and T, and controller 2, in turn, provides control signals to inlet controller 40 and outlet controller 41 in order to maintain $P/T^n$ substantially constant.

In operation, gas introduced into the chamber 20 through aperture 24 is ionized by microwave ECR heating. The plasma is contained by the field from magnet 31 while the chamber wall is protected by liner 22. Ions for plasma processing are drawn toward a workpiece on electrode 23 by application of a suitable bias to the electrode. P and T are measured, and the pressure P is varied in proportion to $T^n$ so that $P/T^n$ is constant. Preferably, P is maintained proportional to the first power of T by adjusting the inlet flow rate and/or the outlet pumping speed. For chemically reactive systems it is preferred to adjust the pressure by adjusting the flow rate so that the mean gas residence time remains substantially constant. It is to be understood that T is to be measured by an absolute scale. It is also to be understood that T can be measured from any material in thermal equilibrium with the gas.

In a specific embodiment, generating apparatus 10 can comprise an Astex S-1500 ECR source. Gas inlet controller 40 can be an MKS Multigas 147 Controller and outlet controller 41 can be a VAT PM-5 adaptive pressure controller. With this apparatus pump 42 can be a Balzers TCP 5000, pressure sensor 43 a MKS 390 HA and temperature probe 1 an Omega Type E thermocouple. Typical process operating parameters are as follows:

| Process Parameter | Representative Value |
|---|---|
| Microwave frequency | 2.45 GHz |
| Microwave power | 0.3 to 1.5 KW |
| Gas pressure | 0.1 to 10 m Torr |
| Magnetic field | 0–1000 Gauss (with 875 Gauss at the ECR condition created by 180 A current in the FIG. 3 apparatus) |
| Gas flow rate | 1–100 sccm |
| Pumping speed | 100–1500 liters/s |
| RF bias | 0–100 V |

Figure 4:
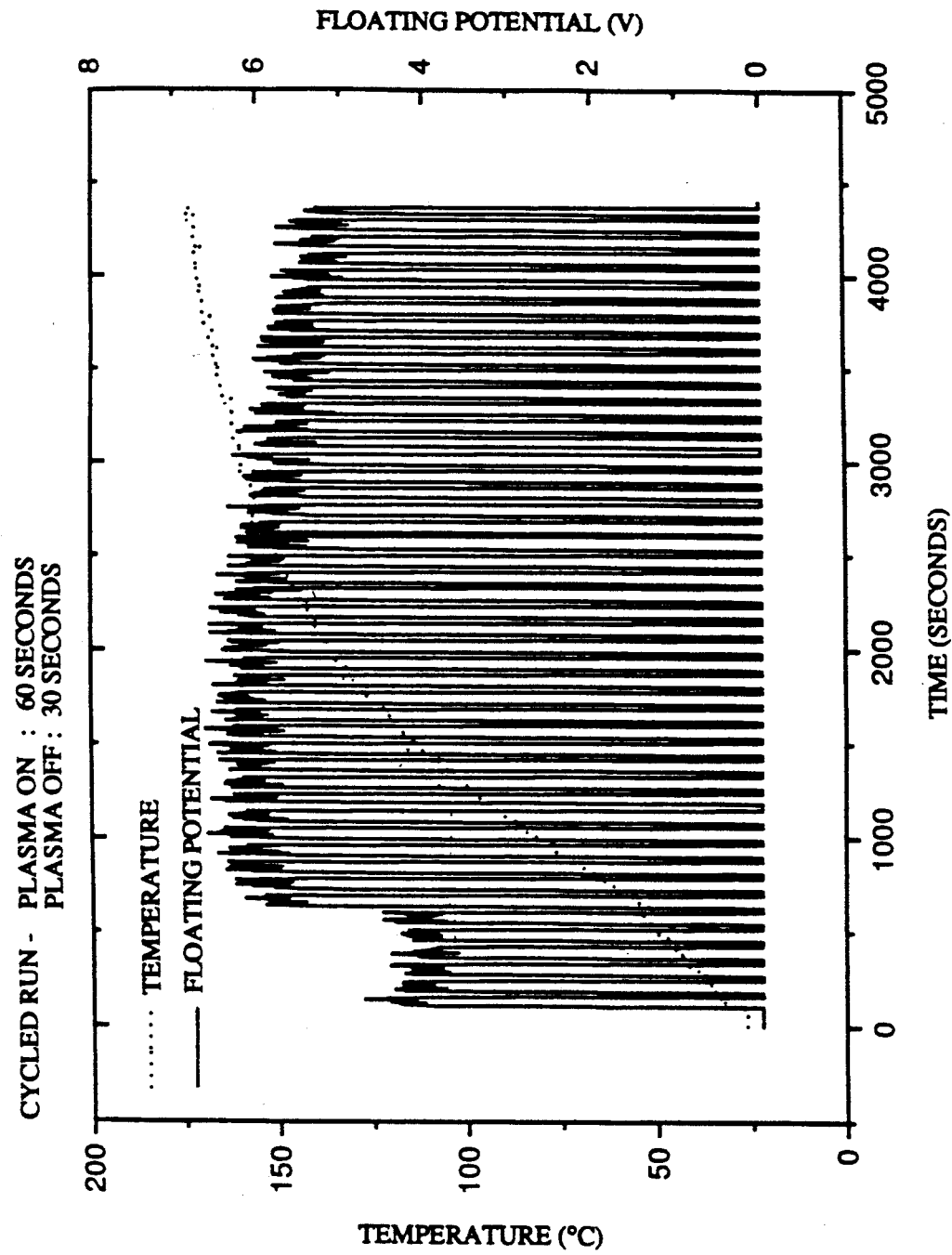
FIG. 4 is a graphical illustration showing a simulated manufacturing process cycle with the plasma controlled by pressure alone.
Figure 5:
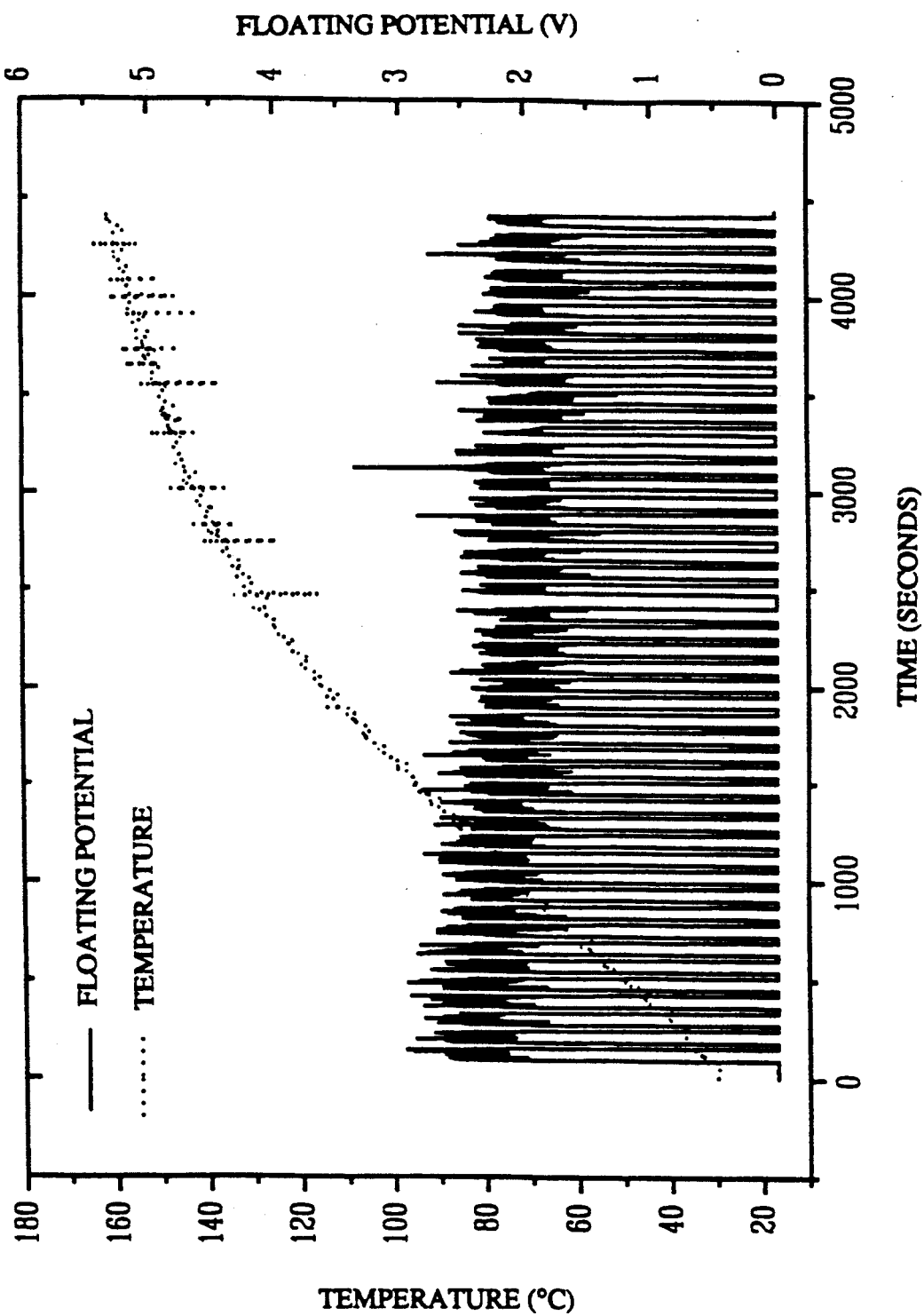
FIG. 5 is a graphical illustration of the same simulated process cycle with the plasma controlled by maintaining a constant ratio $P/T$.

FIGS. 4 and 5 are graphical illustrations useful in showing the improvement in plasma stability effected by P/T control. FIG. 4 is a plot of floating potential (and temperature) versus time in a simulated manufacturing process sequence wherein the microwave input power is gated on for 60s then off for 30s. The plasma on-time corresponds to process time while the off-time corresponds to the time needed to remove the processed wafer from the chamber and install the next wafer to be processed. FIG. 4 shows the process where pressure alone is maintained constant. Significantly, temperature increases and instability is encountered at the fifth cycle. FIG. 5 shows the process where P/T is maintained constant. Temperature increases, but no instability is encountered in 48 cycles.

It is to be understood that the above described embodiments are illustrative of only a few of the many possible specific embodiments which can represent applications of the principles of the invention. For example, the invention was illustrated in the context of an ECR plasma generator but is equally applicable to control of reactors using other types of plasma generation. Thus, numerous and varied other arrangements can be readily devised by those skilled in the art without departing from the spirit and scope of the invention.

We claim:

1. In a process for generating a plasma of the type comprising the steps of supplying gas to a reduced pressure chamber, supplying energy to ionize the gas and removing gaseous material from said chamber, the gas within said chamber characterized by a gas pressure P and an absolute gas temperature T, the improvement wherein:

the stability of said plasma is enhanced by operating said process at a constant value of $P/T^n$ wherein n is greater than zero.

2. The improved process of claim 1 wherein said process is operated at a constant value of P/T by varying the gas pressure P in proportion to the gas temperature T.

3. The improved process of claim 2 wherein varying said gas pressure comprises varying the flow rate of gas into said chamber.

4. The improved process of claim 2 wherein varying said gas pressure comprises varying the rate of removing gaseous materials from said chamber.

5. The improved process of claim 4 wherein the rate of removing gaseous materials from said chamber is chosen to maintain a constant gas residence time within said chamber.

6. The improved process of claim 1 wherein said energy to ionize said gas is microwave energy at the electron cyclotron resonance frequency.

7. In a process for generating a plasma of the type supplying gas to a reduced pressure chamber, supplying energy to ionize the gas and removing gaseous material from said chamber, the gas within said chamber characterized by a gas pressure P and an absolute gas temperature T, and the plasma generated characterized by instability for one or more specific values of the ratio P/T, the improvement wherein:

the stability of said plasma is enhanced by operating said process at a value of P/T removed from said specific values.

8. The improved process of claim 7 wherein the gas pressure P is varied in proportion to the temperature T.

* * * * *